US006315189B1

(12) United States Patent
Williams

(10) Patent No.: US 6,315,189 B1
(45) Date of Patent: Nov. 13, 2001

(54) SEMICONDUCTOR PACKAGE LEAD PLATING METHOD AND APPARATUS

(75) Inventor: Charles E. Williams, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/417,452

(22) Filed: Oct. 13, 1999

Related U.S. Application Data
(60) Provisional application No. 60/104,075, filed on Oct. 13, 1998.

(51) Int. Cl.[7] .............................. B23K 31/02; B23K 1/20
(52) U.S. Cl. .................... 228/180.1; 228/254; 228/42; 228/43; 228/206; 29/743
(58) Field of Search .................. 228/254, 180.1, 228/42, 43, 206; 29/743

(56) References Cited

U.S. PATENT DOCUMENTS

| Re. 32,982 | * | 7/1989 | O'Rourke | 228/180.1 |
|---|---|---|---|---|
| 3,650,017 | * | 3/1972 | Gal | 29/527.4 |
| 3,765,591 | * | 10/1973 | Cook | 228/36 |
| 4,277,518 | * | 7/1981 | SChillke et al. | 427/96 |
| 4,402,448 | * | 9/1983 | O'Rourke | 228/125 |
| 4,563,974 | * | 1/1986 | Price | 118/66 |
| 4,610,391 | * | 9/1986 | Nowotarski | 228/219 |
| 4,611,397 | * | 9/1986 | Janisiewicz et al. | 29/834 |
| 4,706,602 | * | 11/1987 | Polacek | 118/63 |
| 4,720,396 | * | 1/1988 | Wood | 427/96 |
| 4,799,450 | * | 1/1989 | Cornellier | 118/63 |
| 4,838,476 | * | 6/1989 | Rahn | 228/180.1 |
| 5,044,542 | * | 9/1991 | Deambrosio | 228/37 |
| 5,130,164 | * | 7/1992 | Hutchinson et al. | 427/123 |
| 5,177,844 | * | 1/1993 | Swift | 29/721 |
| 5,209,782 | * | 5/1993 | Morris | 118/603 |
| 5,227,604 | * | 7/1993 | Freedman | 219/121.63 |
| 5,242,096 | * | 9/1993 | Tsunabuchi et al. | 228/9 |
| 5,317,803 | * | 6/1994 | Spigarelli et al. | 29/840 |
| 5,340,013 | * | 8/1994 | Poole et al. | 228/119 |
| 5,361,969 | * | 11/1994 | Gileta | 228/180.1 |
| 5,388,752 | * | 2/1995 | Kawakatsu | 228/20.1 |
| 5,411,645 | * | 5/1995 | Tench | 204/140 |
| 5,525,777 | * | 6/1996 | Kukuljan | 219/121.83 |
| 5,611,480 | * | 3/1997 | Ciniglio et al. | 228/180.1 |
| 5,637,833 | * | 6/1997 | Banks et al. | 119/261 |
| 5,639,011 | * | 6/1997 | Jacks et al. | 228/180.21 |
| 5,678,752 | * | 10/1997 | Kaminsky et al. | 228/223 |
| 5,683,743 | * | 11/1997 | Banks et al. | 427/96 |
| 5,722,581 | * | 3/1998 | Sindzingre et al. | 228/206 |
| 5,816,473 | * | 10/1998 | Nishikawa et al. | 228/6.2 |
| 5,922,230 | * | 7/1999 | Yokota | 219/388 |
| 5,983,490 | * | 11/1999 | Sakemi | 29/833 |
| 6,000,523 | * | 12/1999 | Asai et al. | 198/377.08 |
| 6,013,381 | * | 1/2000 | Bobbio et al. | 428/628 |
| 6,164,515 | * | 12/2000 | Andrus et al. | 228/20.1 |
| 6,168,065 | * | 1/2001 | Willeman | 228/9 |

FOREIGN PATENT DOCUMENTS

| 06005761 | * | 1/1994 | (JP) | 228/175 |
|---|---|---|---|---|
| 6-5761-A | * | 1/1994 | (JP) | 228/180.1 |
| 501857-A | * | 4/1976 | (RU) | 228/180.1 |

OTHER PUBLICATIONS

IBM Technical Business Disclosure, Nov. 1988, TBD–AC-C–NO: NN8811367, vol. 31, Issue 6, pp. 367–369, Nov. 1988.*

* cited by examiner

Primary Examiner—Tom Dunn
Assistant Examiner—L. Edmondson
(74) Attorney, Agent, or Firm—Wade James Brady, III; Frederick J. Telecky, Jr.

(57) ABSTRACT

A method and apparatus for uniformly solder plating leads on semiconductor packages wherein the leads are rotated during the solder plating process and the solder on the leads in planarized and solder between and bridging the leads is removed by the application of a hot gas to the device having the leads. The hot gas is preferably $N_2$ which is inert to the process flow at the point in the process when it is utilized.

12 Claims, 7 Drawing Sheets

SEMICONDUCTOR PACKAGE LEAD PLATING METHOD AND APPARATUS

This is a continuation of provisional application 60/104,075, filed Oct. 13, 1998.

FIELD OF THE INVENTION

The invention relates to semiconductor device packages, and more particularly to a method and apparatus of plating package leads which cannot be immersed in liquid solutions.

BACKGROUND OF THE INVENTION

The leads of semiconductor packages are often solder plated after the package is formed. Many packages are moisture sensitive and cannot be placed in solder flux or other solutions which may be used in the plating process. A wave soldering process is often used in plating leads by moving the device leads across the top of a solder source to coat the leads with solder. This can cause buildup of solder on the leads and also forms solder bridges between the leads.

The use of a soldering bath is described in U.S. Pat. No. 5,161,727. A non-oxidizing atmosphere is used above a solder bath and a conveyor is used to move the parts to be solder plated over the solder bath. This patent defines in particular the housing for providing the non-oxidizing atmosphere above the solder bath.

An apparatus for circulating hot air and a method for wave soldering is defined in U.S. Pat. No. 5,379,943. A fluxed is used to apply the flux to the item to be soldered. High pressure air is circulated within the apparatus and directed against the fluxed surfaces prior to the application of solder.

Additional solder apparatus are described in U.S. Pat. Nos. 5,240,169, 5,228,614 and 5,722,581.

SUMMARY OF THE INVENTION

The invention is a method and apparatus for solder plating leads on semiconductor packages. In the method for solder plating the leads of a semiconductor device, an apparatus in a controlled atmosphere picks up a semiconductor in a carrier. The carrier is moved through a preheat and clean station where a reducing gas cleans the leads. The semiconductor package leads are then moved into a solder bath where the leads are contacted with molten solder, or coated with a solder paste. Partially through the bath, the package is rotated ninety degrees to allow solder to flow along the lengths of the leads originally extending transverse to the movement of the package leads through the solder. The package leads are removed from the solder and a gas, for example $N_2$, is blown across the leads to level the solder on the leads, and to remove solder bridging the leads. The package is then moved to an unload station.

The apparatus used in he plating process includes a continuous conveyor track on which is mounted at least one carrier apparatus which is used to carry a package through the plating process. The carrier has a plurality of flexible legs that are sprung open at a pickup station to received a package. A vacuum may be used to draw the package upward between the flexible legs. The vacuum holds the package in place until the carrier begins to move and the flexible legs are allowed to move toward the package, holding it in place. The carrier has a gear to which the flexible legs are attached to permit the flexible legs and package to be rotated when over the solder plating bath to allow uniform flow of solder during the plating process.

DESCRIPTION OF A PREFERRED EMBODIMENT

Figure 1:
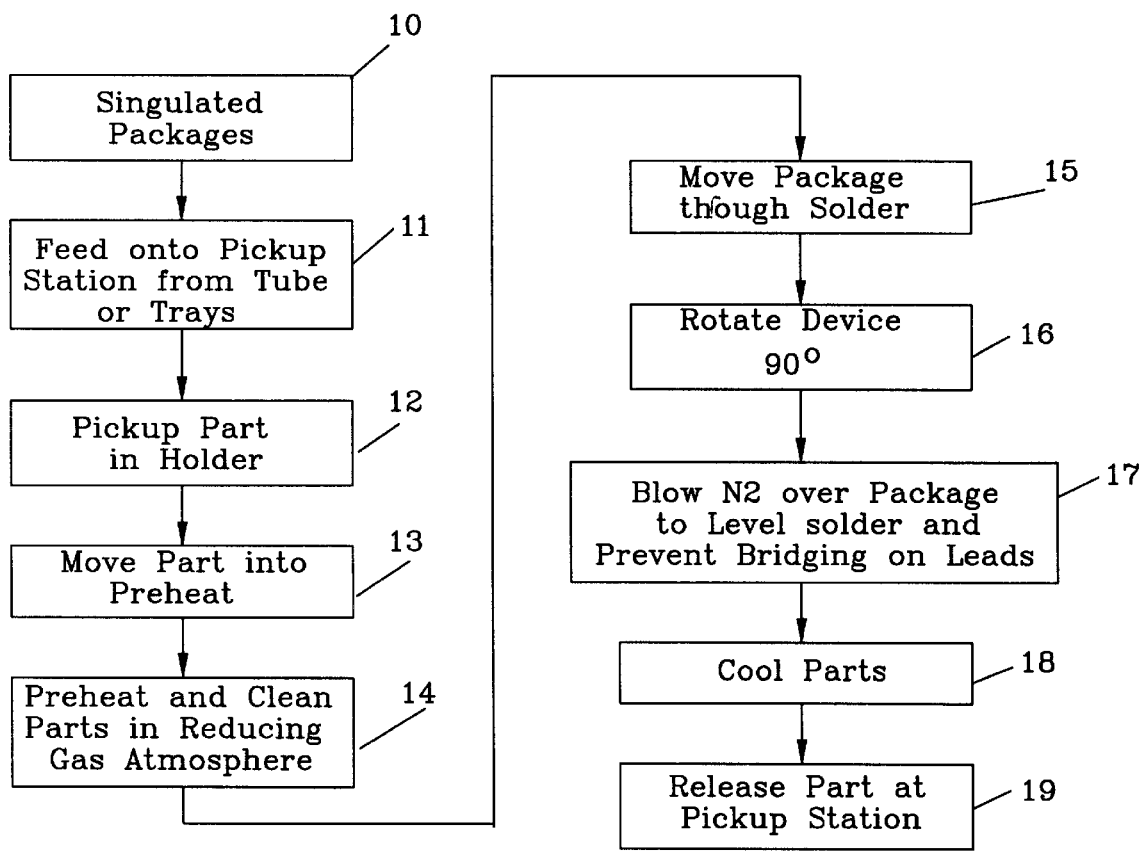
FIG. 1 is a flow diagram of the process for plating the package leads in the solder station apparatus.

In processing semiconductor device, the packages may be formed in strips and singulated into individual devices for further processing. FIG. 1 is a flow diagram showing the basic process in solder plating the leads of the semiconductor device. The devices are singulated, or separated into single devices (10). Each device is moved to a pickup station (11) and then picked up by holder (12) which holds and transports the device during the process of solder plating the device leads. The package leads are coated with solder by moving the package leads through the solder (15) to solder plate the leads. Alternately, the leads are lowered onto solder paste to coat the device leads. Partially through the solder, if, for example, the leads of quad package are being solder plated, the package is rotated ninety degrees (16) in the molten solder to allow solder to flow along the lengths of the leads on each side. When a solder paste is used, the device is lowered into the solder paste to coat at least the bottom of the leads.

After solder has been applied to the leads, a gas, for example, $N_2$ is blown over the device (17) and leads to level the solder on the leads, and to remove excess solder, and any solder that is bridging between the leads. When solder paste is used, the solder paste is subject to the hot gas to cause the solder to coat the leads. The device is then cooled (18) and released from the holder at a pickup station (19) where the device is moved in to a tray or tube.

Figure 2A:
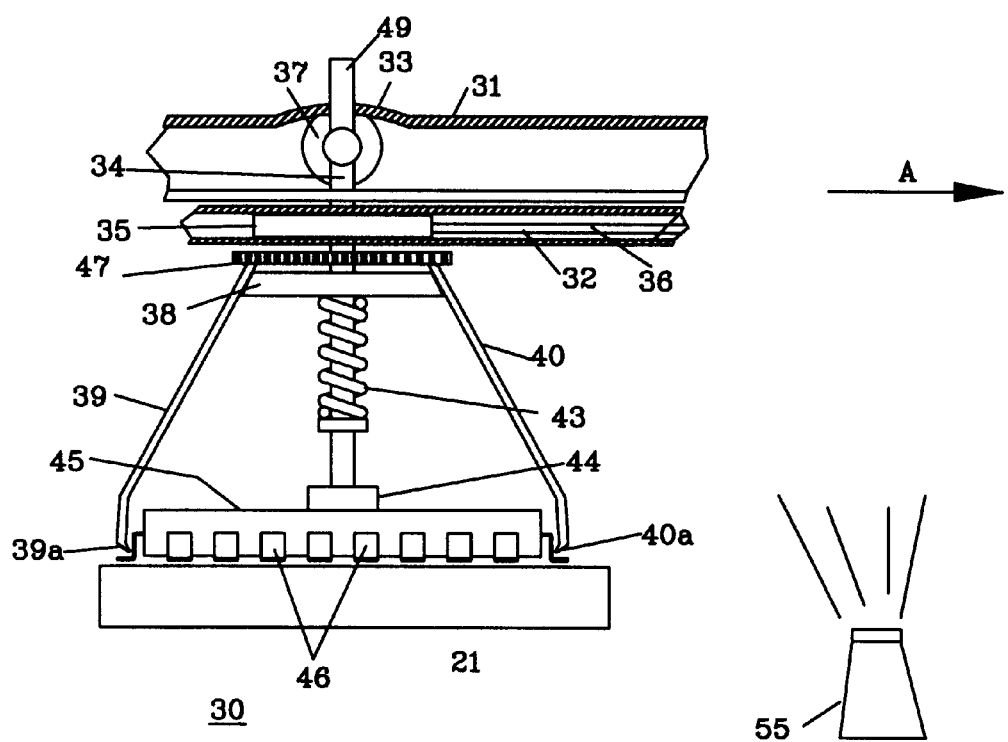
FIGS. 2a, 2b and 2c show a partial view of the solder station apparatus.
Figure 2B:
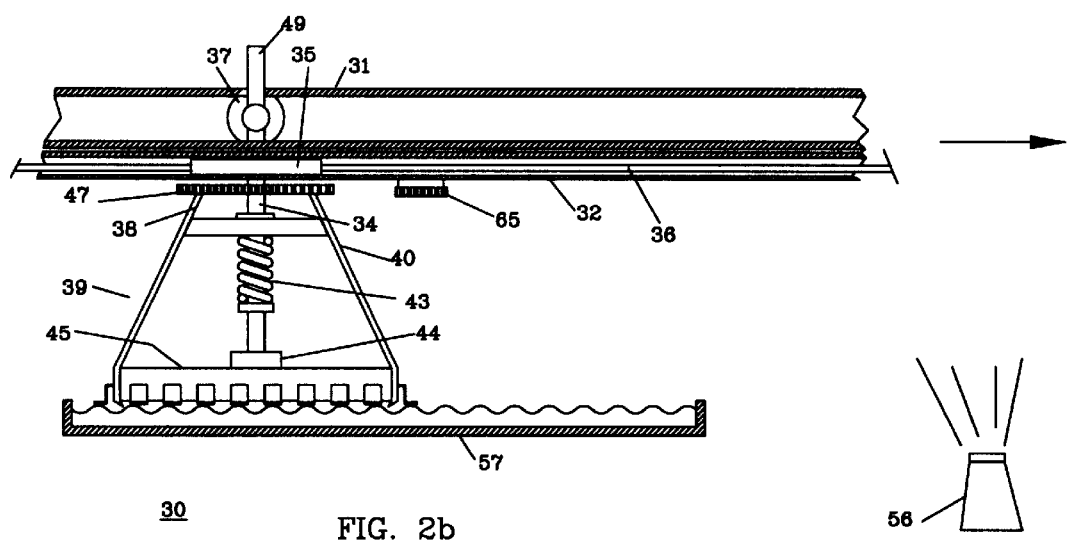
Figure 2C:
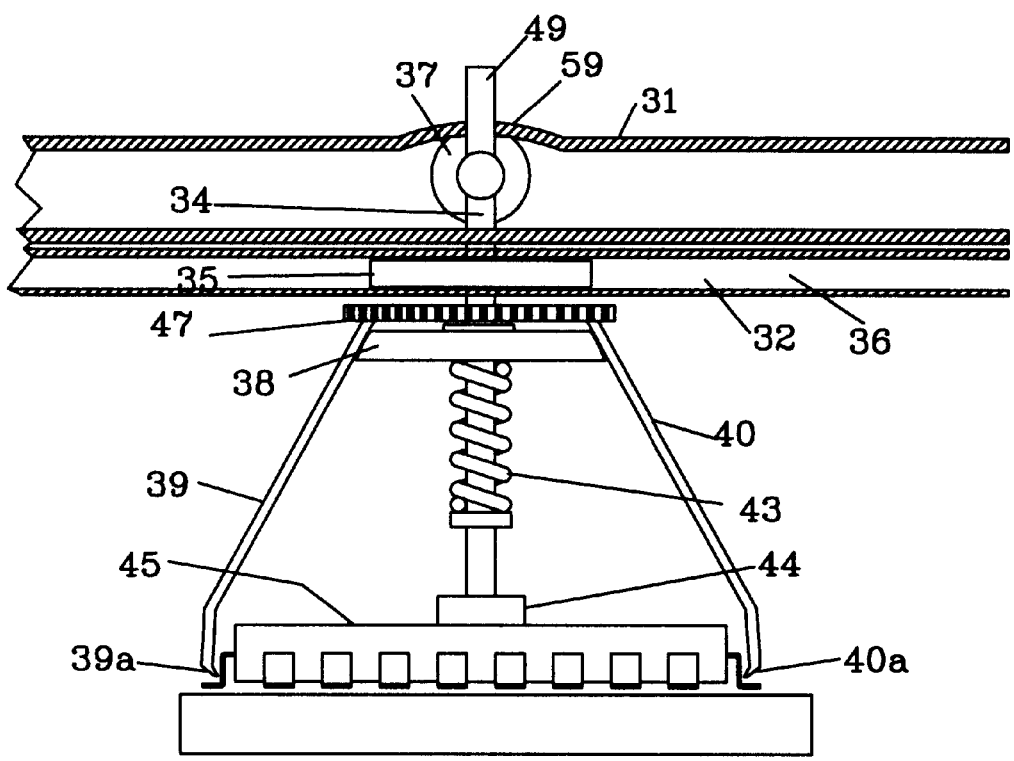
Figure 3:
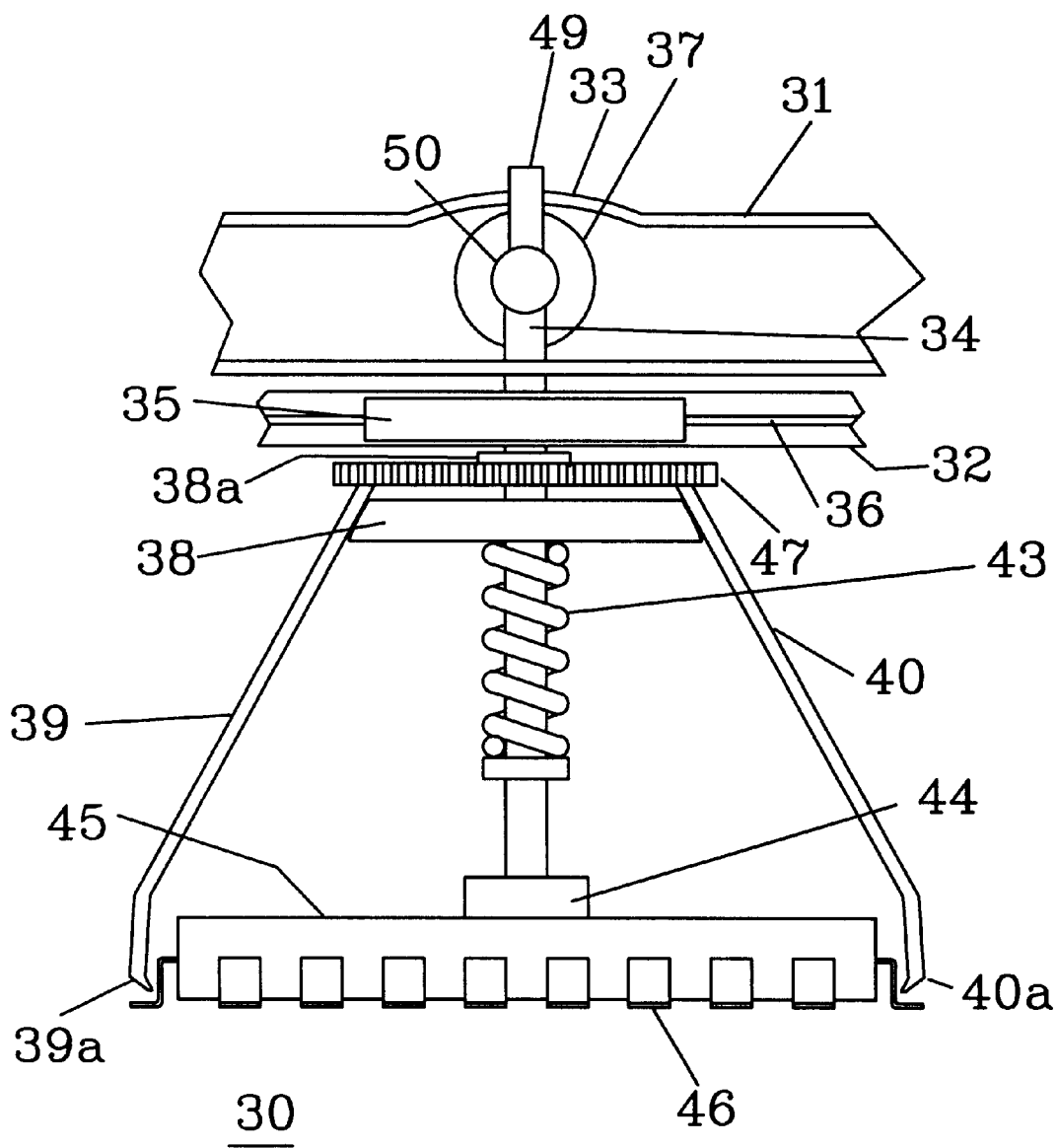
FIG. 3 shows the semiconductor package pickup and holding device at the device pickup station.

FIGS. 2a, 2b, and 2c show the apparatus for carrying the devices during the lead plating process. The process takes place in an enclosed environment (not illustrated) to permit the circulation of the gases as described in the process. In FIG. 2a, a semiconductor device 45 is placed on a pickup station 21. As the device carrier 30 is moved into position to pick up a device, a roller 37, mounted on hollow shaft 34, moves into indentation 33 on roller track 31. Spring 43 expands as roller 37 moves into indentation 33 and pushes wedge 38 upward, springing holder legs 29–42 (only 39 and 40 shown in FIG. 2a) outward. A vacuum is applied to end 49 of hollow shaft 34 creating a vacuum pull at the end of chamber 44 on shaft 34. The vacuum will pull device 45 upward against chamber 44. As roller 37 moves out of indentation 33, shaft 34 will push downward on wedge 38(i) allowing the ends 39a–42a to close at the corners of device 45, securing device in carrier 30.

Carrier 30 is moved along track 32 with slide 35 which is attached to a cable 36. Tracks 31 and 32 form a circular path (not illustrated). Slide 35 is attached to cable 36 which pulls carrier 30 along the track 32. After the device is secured in carrier 30 and is moving as indicated by arrow A, device 45 moves over a preheat and cleaning station 55. As each device is moved into a preheat station 55, the device is preheated and the leads are cleaned in a reducing gas atmosphere. In the cleaning process, all oxides and other contaminants are removed from the leads 46 to prepare the leads for solder plating. By cleaning the leads in this manner, it is not necessary to use any liquid cleaners or solder flux prior to applying the solder.

FIG. 2b shows carrier 30, with device 45, after the carrier is moved over solder tank 57. The leads of device 45 are moved through the solder for about half the length of tank 57 and then gear 47, secured to shaft 34, engages rack gear 65 turning the part of carrier 30 which includes the legs 39–40, spring 43, chamber 44, wedge 38 and gear 47, ninety degrees. This rotates device 45 ninety degrees. This permits an even distribution of solder along the leads 46 of device 45.

After solder has been applied to leads 46, a hot gas at station 56, for example, $N_2$ is blown over the device 45 and the leads 46 to level the solder on leads 46, and to remove excess solder and any solder that is bridging between the leads. In the process where a solder paste is used, the hot gas blown over the leads melts the solder paste coating at least the bottom surfaces of the leads with solder. The device is at least partially cooled in the process.

In FIG. 2c, carrier 30 is shown at the unload station 58 where device 45 is removed from carrier 30 is. As carrier 30 moved over station 58, roller 37 is moved into indentation 59 to allow spring 43 to push wedge 38 upward spreading legs 39–40 and moving leg ends 39a–42a from under device 45. This will release device 45 on to station 58. A jet of air may be applied to end 49 of hollow shaft 34 to push device 45 downward, or a vacuum (not illustrated) may be applied to the bottom of device 45 to pull it against station 58.

Carrier 30 is then moved around its circular path to pick up another device for processing.

FIG, 3 is a detailed view of carrier 30 when it is over a pickup or release station. Legs 39–42 are attached to gear 47 so that when gear 47 is rotated then, legs 39–42 will rotate with gear 47. Wedge 38 is mounted on shaft 34 and biased upward by spring 43. When roller 37 is moved upward into indentation 33, spring 43 moves wedge 38 upward, spreading legs 39–40. Wedge 38 stops when it engages ring 38a which is securely fasten to shaft 34. This prevents wedge 38 from spreading legs 39–40 more than necessary to pick up a device 45. When carrier 30 and roller 37 are moved out of the indentation 33, roller 37 will move shaft 34 downward and ring 38a will move wedge 38 is downward compressing spring 43. As wedge 38 moved downward, legs 39–40 will spring inward, moving the ends 39a–42a under device 45 to hold device 45 firmly against housing 44. As indicated above, a vacuum may be temporarily applied to the end 49 of shaft 34 to apply a vacuum at the housing 44 to hold device 45 in placed until carrier 30 moves along tracks 31 and 32 to cause legs 39–40 to hold device 45 in place.

Figure 4:
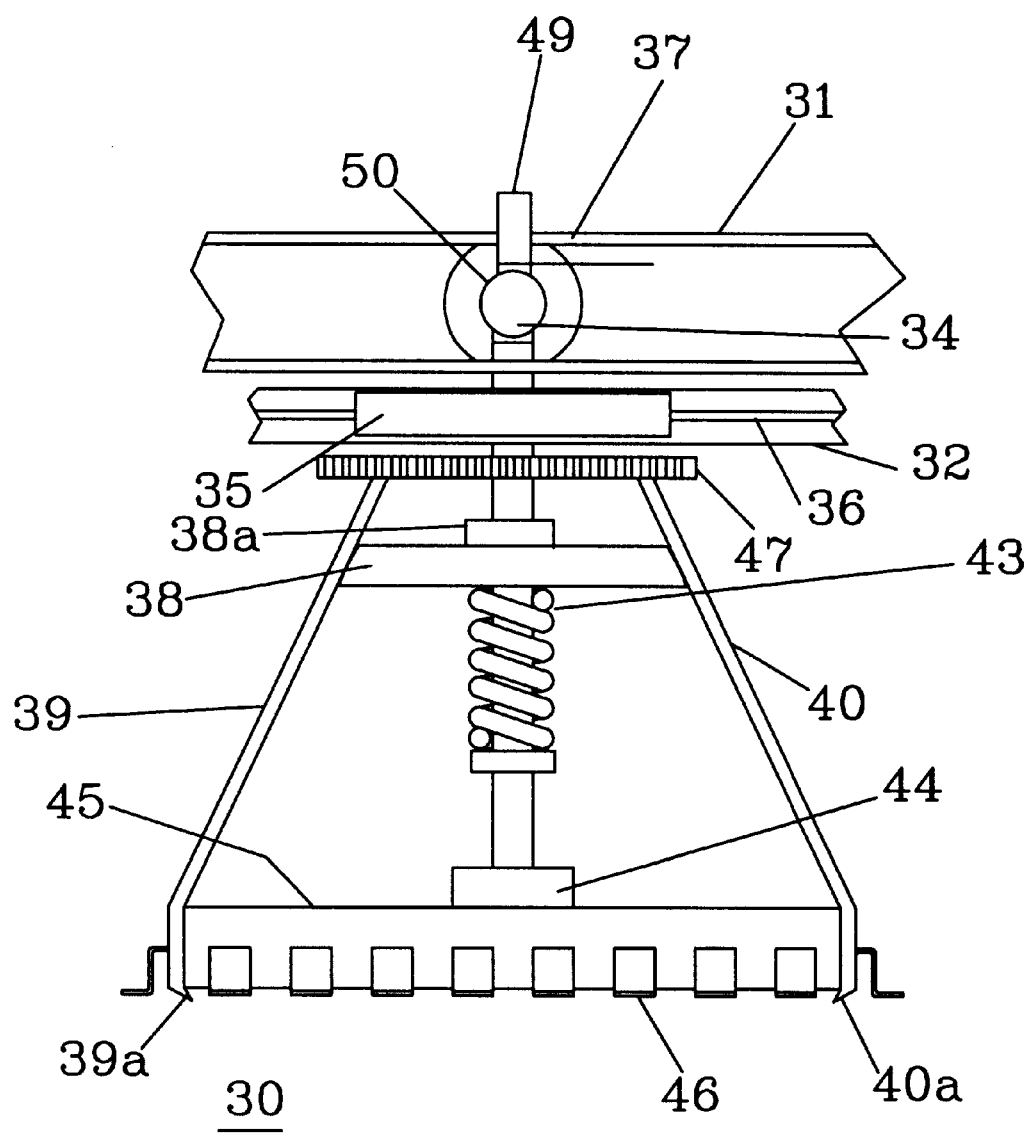
FIG. 4 shows the holding device holding a semiconductor package.

FIG. 4 shows carrier 30 with roller 37 in a non-indentation part of track 31. Legs 39–42 are closed, holding the device 45 in position. Since shaft 34 is in a "downward" position, ring 38a has moved wedge 38 downward, releasing legs 39–42. In FIG. 4, leg ends 39a and 40a are shown extending slightly under device 45, holding it up against housing 44.

Figure 5:
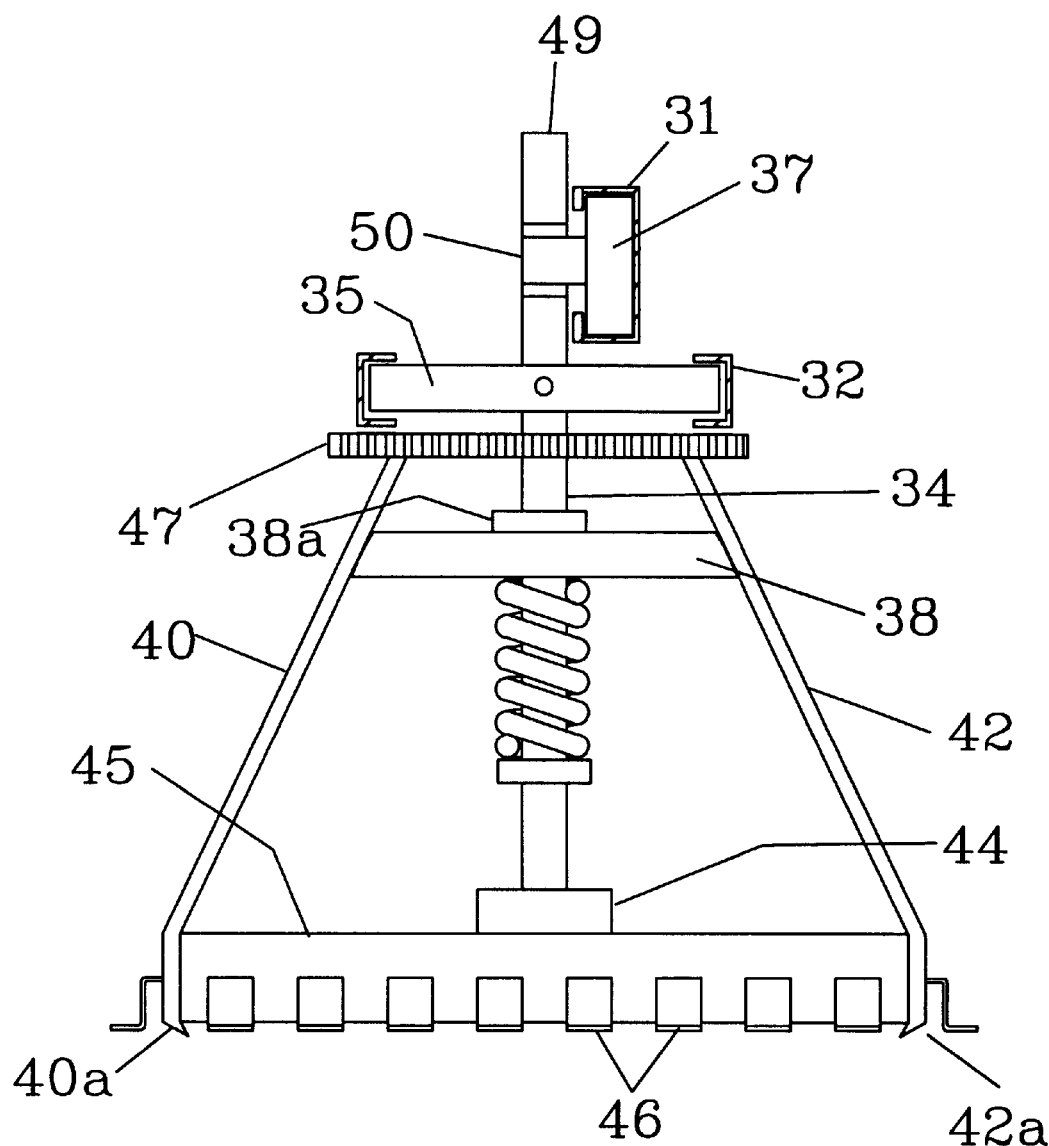
FIG. 5 is a side view of the holding device holding a semiconductor package.

FIG. 5 is an end view of carrier 30 showing roller 37 in track 31 and slide 35 in track 32. Slide 35 in track 32 stabilizes carrier 30 as it is moved horizontally in a circular path, and track 31 has the indentations at the appropriate station to allow the loading or unloading of a device from carrier 30. Shaft 34 moves up and down freely in slide 35 and is held in the proper vertical location by the movement of roll 37 in track 31.

Only one carrier is shown, but there may be a plurality of carriers on the circular conveyor, each carrying a package whose leads are to be solder plated.

What is claimed is:

1. A method for solder plating the leads of a semiconductor device, comprising the steps of:

providing a semiconductor device having leads;

providing a source of solder having a surface;

moving the leads through said source of solder in a direction parallel to the surface of said source of solder to coat said leads with said solder;

rotating said leads while in said solder and continuing moving of said leads through said solder in said direction parallel to the surface of said source of solder;

then removing said leads from said solder and exposing the leads with said solder thereon and solder bridging said leads to a hot stream of gas sufficient to level the solder and to remove solder bridging said leads; and then releasing the device to a pickup station.

2. The method according to claim 1, further including the step of cleaning the leads in a reducing gas atmosphere prior to moving the leads through a source of solder.

3. The method according to claim 2, further including the step of preheating the device prior to cleaning in a reducing gas.

4. A method for solder plating the leads of a semiconductor device, comprising the steps of:

picking up a device having leads in a holder;

cleaning the leads in a reducing gas atmosphere;

providing a source of solder having a surface;

then moving the leads through said source of solder and in a direction parallel to said surface;

rotating the leads ninety degrees in a direction parallel to said surface while in the solder and continuing moving the leads through said source of solder in a direction parallel to said surface;

then removing said leads from said solder and exposing the device to a stream of nitrogen gas to level the solder and to remove solder bridging between leads; and releasing the device to a pickup station.

5. An apparatus having a plurality of process stations for solder plating the leads of a semiconductor device including a conveyor track enclosed in controlled atmosphere housing comprising:

a load station for loading a semiconductor device;

a device carrier apparatus, to which a semiconductor device having leads is attached, moveably mounted on said conveyor track for moving the device through the process stations;

a cleaning station for moving a reducing gas across the device leads;

a solder source having a surface;

means for passing said leads through said solder source along a path parallel to said surface, rotating said leads and continuing to pass said leads through said solder source along a path parallel to said surface;

means for directing a hot gas over and between the leads to planarize the solder on said leads and remove the solder bridging the leads; and an unload station for removing the device from the carrier apparatus;

said means for passing including a first gear on said carrier apparatus and a second gear on said conveyor track for rotating said carrier apparatus.

6. The apparatus according to claim 5, wherein said carrier apparatus includes a plurality of legs to hold the device during the solder plating process.

7. The apparatus according to claim 6, including a hollow shaft with a chamber on one end of said hollow shaft on said carrier device for applying a vacuum to lift a device upward so that the plurality of legs may secure the device in the carrier.

8. The apparatus according to claim 5, wherein said device carrier apparatus is mounted in said conveyor track at a first location by a slide and a second location by a roller.

9. The apparatus according to claim 5, wherein the solder is selected from one of molten solder and a solder paste.

10. An apparatus having a plurality of process stations for solder plating the leads of a semiconductor device including a conveyor track enclosed in controlled atmosphere housing comprising:

a load station for loading a semiconductor device;

a device carrier apparatus, to which a semiconductor device having leads is attached, moveably mounted on said conveyor track for moving the device through the process stations;

a cleaning station for moving a reducing gas across the device leads;

a solder source having a surface;

means for passing said leads through said solder source along a path parallel to said surface, rotating said leads and continuing to pass said leads through said solder source along a path parallel to said surface;

means for directing a hot gas over and between the leads to planarize the solder on said leads and remove the solder bridging the leads; and an unload station for removing the device from the carrier apparatus; and wherein said conveyor track has offset regions at each of said load and unload stations.

11. An apparatus having a plurality of process stations for solder plating the leads of a semiconductor device including a conveyor track enclosed in controlled atmosphere housing comprising:

a load station for loading a semiconductor device;

a device carrier apparatus, to which a semiconductor device having leads is attached, moveably mounted on said conveyor track for moving the device through the process stations;

a cleaning station for moving a reducing gas across the device leads;

a solder source having a surface;

means for passing said leads through said solder source along a path parallel to said surface, rotating said leads and continuing to pass said leads through said solder source along a path parallel to said surface;

means for directing a hot gas over and between the leads to planarize the solder on said leads and remove the solder bridging the leads; and an unload station for removing the device from the carrier apparatus;

wherein said carrier apparatus includes a plurality of legs to hold the device during the solder plating process;

wherein said plurality of legs are attached to a gear used in rotating said carrier.

12. An apparatus having a plurality of process stations for solder plating the leads of a semiconductor device including a conveyor track enclosed in controlled atmosphere housing comprising:

a load station for loading a semiconductor device;

a device carrier apparatus, to which a semiconductor device having leads is attached, moveably mounted on said conveyor track for moving the device through the process stations;

a cleaning station for moving a reducing gas across the device leads;

a solder source having a surface;

means for passing said leads through said solder source along a path parallel to said surface, rotating said leads and continuing to pass said leads through said solder source along a path parallel to said surface;

means for directing a hot gas over the leads; and an unload station for removing the device from the carrier apparatus;

wherein said device carrier includes:

a set of flexible legs, secured to a gear, for holding a semiconductor device;

a shaft secured to a roller mounted in the conveyor track; and a wedge and a spring mounted on the shaft for flexing the flexible legs outward, when the wedge is in a first position for receiving a semiconductor device and for allowing the legs to flex inward while the wedge is in a second position to hold the semiconductor device in place in the carrier.

* * * * *